(12) United States Patent
Rotter et al.

(10) Patent No.: US 7,586,962 B1
(45) Date of Patent: Sep. 8, 2009

(54) INTEGRATED DIAMOND CARRIER FOR LASER BAR ARRAYS

(75) Inventors: Shlomo Z. Rotter, Riverside, OH (US); Susan L. Heidger, Kettering, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 452 days.

(21) Appl. No.: 11/091,684

(22) Filed: Mar. 28, 2005

Related U.S. Application Data

(60) Provisional application No. 60/557,451, filed on Mar. 29, 2004.

(51) Int. Cl.
H01S 3/04 (2006.01)

(52) U.S. Cl. .................. 372/36; 372/34; 372/50.11; 372/50.12; 372/50.121

(58) Field of Classification Search .............. 372/50.11, 372/50.12, 50.121, 34, 36
See application file for complete search history.

(56) References Cited

U.S. PATENT DOCUMENTS

| | | | | |
|---|---|---|---|---|
| 4,881,237 A | * | 11/1989 | Donnelly | 372/50.12 |
| 5,012,477 A | * | 4/1991 | Mesquida et al. | 372/50.12 |
| 5,325,384 A | * | 6/1994 | Herb et al. | 372/36 |
| 5,365,533 A | * | 11/1994 | Groussin | 372/36 |
| 5,642,373 A | * | 6/1997 | Kamizato et al. | 372/50.1 |
| 6,356,577 B1 | * | 3/2002 | Miller | 372/107 |
| 6,487,224 B1 | * | 11/2002 | Ohashi et al. | 372/43.01 |
| 2002/0006145 A1 | * | 1/2002 | Evans | 372/50 |

* cited by examiner

*Primary Examiner*—Minsun Harvey
*Assistant Examiner*—Yuanda Zhang
(74) *Attorney, Agent, or Firm*—AFMCLO/JAZ; Gerald B. Hollins

(57) ABSTRACT

A mounting improvement for the solid state laser bars used for example to pump high power lasers is provided. Solid state laser bars are mounted in side by side relationship and combined with integrated substrate and laser output directing optical elements on a disclosed Integrated Diamond Carrier. The Integrated Diamond Carrier is preferably fabricated as an essentially freestanding base plate of diamond composition with incorporated arrays of mesa structures providing mounting for the laser bars and providing integral laser output directing optical elements such as mirrored prisms. Integrated diamond carriers according to the invention provide stable positioning, desirable thermal conductivity and consistent low temperature operation for the solid state lasers.

4 Claims, 13 Drawing Sheets
(1 of 13 Drawing Sheet(s) Filed in Color)

"no heat spreader"

"CVD diamond heat spreader"

INTEGRATED DIAMOND CARRIER FOR LASER BAR ARRAYS

CLAIM OF PRIORITY

This application claims the benefit of U.S. Provisional Patent Application No. 60/557,451, "INTEGRATED DIAMOND CARRIER (IDC) FOR LASER BAR ARRAYS", filed on 29 Mar. 2004. The contents of this provisional application are hereby incorporated by reference herein.

RIGHTS OF THE GOVERNMENT

The invention described herein may be manufactured and used by or for the Government of the United States for all governmental purposes without the payment of any royalty.

CROSS REFERENCE TO RELATED PATENT DOCUMENTS

The present document is somewhat related to the co pending and commonly assigned patent application document "INTEGRATED DIAMOND CARRIER METHOD FOR LASER BAR ARRAYS", Ser. No. 11/091,685, filed of even date herewith. The contents of this somewhat related application are hereby incorporated by reference herein.

BACKGROUND OF THE INVENTION

The ability to cool a laser diode has been widely recognized as a limitation of current day ability to convert electrical energy into coherent radiant energy in a small space. Since present day laser diodes operate in the realm of fifty percent or lower electrical energy to light energy conversion efficiency and laser diode operation in the temperature range around room temperature are usual factors incurred in laser operation, it is easy to comprehend that efficient removal of unconverted electrical energy proceeds or energy losses, i.e., heat, from a for example, laser bar structure is highly desirable.

One of the better heat removal arrangements currently known in the laser diode art originates in commendable work accomplished by a team of specialists working in the Lawrence Livermore National Laboratory (Lawrence), a United States Government owned laboratory operated for the Government of the U.S. by the University of California. The Lawrence cooling arrangement involves a Silicon Monolithic Microchannel (SiMM) apparatus in which a liquid such as water flowing in an array of closed cross section sub surface channels accomplishes the ultimate removal of heat from a laser diode array. Several U.S. patents describe the Lawrence cooling arrangement; these patents include U.S. Pat. No. 5,828,683. Several other U.S. patents relating to such cooling, patents by Lawrence colleagues and others, are identified in the list of references submitted with the present patent application. Each of these patents, the other patents identified in connection with the present application and the publication references identified in connection with the present application are hereby incorporated by reference herein.

A brief consideration of characteristics of the best available laser diode Silicon Monolithic Microchannel cooling arrangement illustrates the existence of need in the art for even more improved laser diode thermal management tools. To this end the thermal resistance of the Lawrence Silicon Monolithic Microchannel apparatus is estimated to be approximately 0.05 degree Celsius/Watt for a 1 $cm^2$ area due to the thermal conductivity of the employed silicon and the thickness of the carrier structure. For a hypothetical thermal load of 1000 Watts/$cm^2$ that may occur during high power operation of a laser bar, this means the temperature of the top laser mounting surface of the Silicon Monolithic Microchannel will be about 50 degrees Celsius higher than the temperature of the cooling or bottom surface of the Silicon Monolithic Microchannel. Hence it may be appreciated that the efficiency of the Silicon Monolithic Microchannel cooling system is reduced by thermal resistance. In the case of the present invention Integrated Diamond Carrier, the difference between the top laser mounting surface and that of the cooling or bottom surface is only 1 degrees Celsius however as is explained below.

The Silicon Monolithic Microchannel incorporates a cooling system built into the carrier itself, however it incurs difficulties relating to temperature variations from the cooling liquid flow directionality, and with conditions relating to high heat loads. In the latter instance the pressure of the cooling liquid necessary to cool effectively is often excessively high and can damage the built in Silicon Monolithic Microchannel cooling channels. In addition, the Silicon Monolithic Microchannel built in cooling channels are complex and expensive to fabricate.

Other more traditional laser diode packages include arrangements wherein laser bars or other sources of heat loss are clamped between copper plates and mounted on a common carrier. In these arrangements, heat is removed from the laser through the copper plates by the cooling system. The overall thermal resistances achieved with these types of packages are however usually even higher than that incurred with the Silicon Monolithic Microchannel.

Additionally fabrication of a Silicon Monolithic Microchannel device and the more traditional laser bar packages are notably more complex than the simple planar fabrication process of the present invention IDC; especially when the manner in which conventional devices direct the laser beams is considered. Notably the arrangement of the present invention IDC is also well suited for use with highly efficient liquid spray cooling techniques.

As may be appreciated by even a cursory review of the publication references identified in connection with the present application it has for years been suggested that laser diode heat sinks or heat transfer elements made from diamond material can be of assistance in the removal of heat energy losses from a laser diode, a solid state laser. Indeed a number of diamond-inclusive thermal energy management arrangements for such diodes have been disclosed over a period of some thirty or so years. The present invention provides an especially advantageous improvement in this area.

SUMMARY OF THE INVENTION

The present invention provides a fabricated diamond substrate mounting for an array of semiconductor laser diode bars.

It is therefore an object of the present invention to provide a laser diode substrate member of high thermal conductivity and low thermal resistance.

It is another object of the invention to provide a laser diode substrate member contributing to both the mounting and the optical properties of a laser diode array.

It is another object of the invention to provide a laser diode substrate member inclusive of the combination of low thermal resistance and selected laser beam reorientation characteristics.

It is another object of the invention to provide a laser diode substrate member enabling use of a smaller laser diode overall package.

It is another object of the invention to provide an improved thermal management tool capable of providing more uniform operation from a group of commonly mounted lasers.

It is another object of the invention to enable usage of a higher density of laser diode elements in replacing high-powered non-semiconductor lasers.

It is another object of the invention to provide a laser diode mounting arrangement enabling longer operating life from a laser diode assembly.

It is another object of the invention to provide a laser diode mounting arrangement capable of convenient and conventional process fabrication.

It is another object of the invention to provide a laser diode mounting arrangement desirably influenced by characteristics of a sacrificial intermediate material used in its realization.

It is another object of the invention to provide a laser diode mounting arrangement achieved through use of a substrate removal process.

It is another object of the invention to provide a laser diode array mounting arrangement providing a mounting surface efficiently removing laser array heat losses.

It is another object of the invention to provide a laser diode array mounting arrangement that is integrally connected with a laser heat removal element.

It is another object of the invention to provide a laser diode array mounting platform that is integrally connected with a laser light output diverting element.

It is another object of the invention to provide a laser cooling arrangement that lends well to usage in other non-laser environments.

It is another object of the invention to provide a laser diode mounting arrangement having integral laser output reflecting mirrors enabling accurate collection of the output from multiple laser bars.

These and other objects of the invention will become apparent as the description of the representative embodiments proceeds.

These and other objects of the invention are achieved by a high energy solid-state laser array apparatus comprising the combination of:

a plurality of laser diode bar elements disposed in rows of side by side-adjacent bar elements and each inclusive of multiple laser cavities emitting coherent light energy in an optically aligned common direction;

a common substrate member physically carrying each of said side by side adjacent laser diode bar elements in said coherent light optically aligned common direction condition;

said common substrate member including a plurality of elongated elevated integral mesa pedestal elements each carrying a row of said side by side-adjacent bar elements in said coherent light optically aligned common direction condition;

said common substrate member being composed of a thermally conductive material tending to maintain said rows of said side by side-adjacent bar elements at a common thermally cooled operating temperature;

said common substrate member including a plurality of elongated elevated integral optical beam diverting elements interstitially displaced from said integral mesa pedestal elements and each determining a new optically aligned common direction orientation for said laser cavity emitted coherent light energy incident thereon.

BRIEF DESCRIPTION OF THE DRAWINGS

This patent or application file contains at least one photograph executed in color. Copies of this patent or patent application publication with color drawing(s) will be provided by the Office upon request and payment of the necessary fee.

The accompanying drawings incorporated in and forming a part of the specification, illustrate several aspects of the present invention and together with the description serve to explain the principles of the invention. In the drawings.

DETAILED DESCRIPTION

Figure 1:
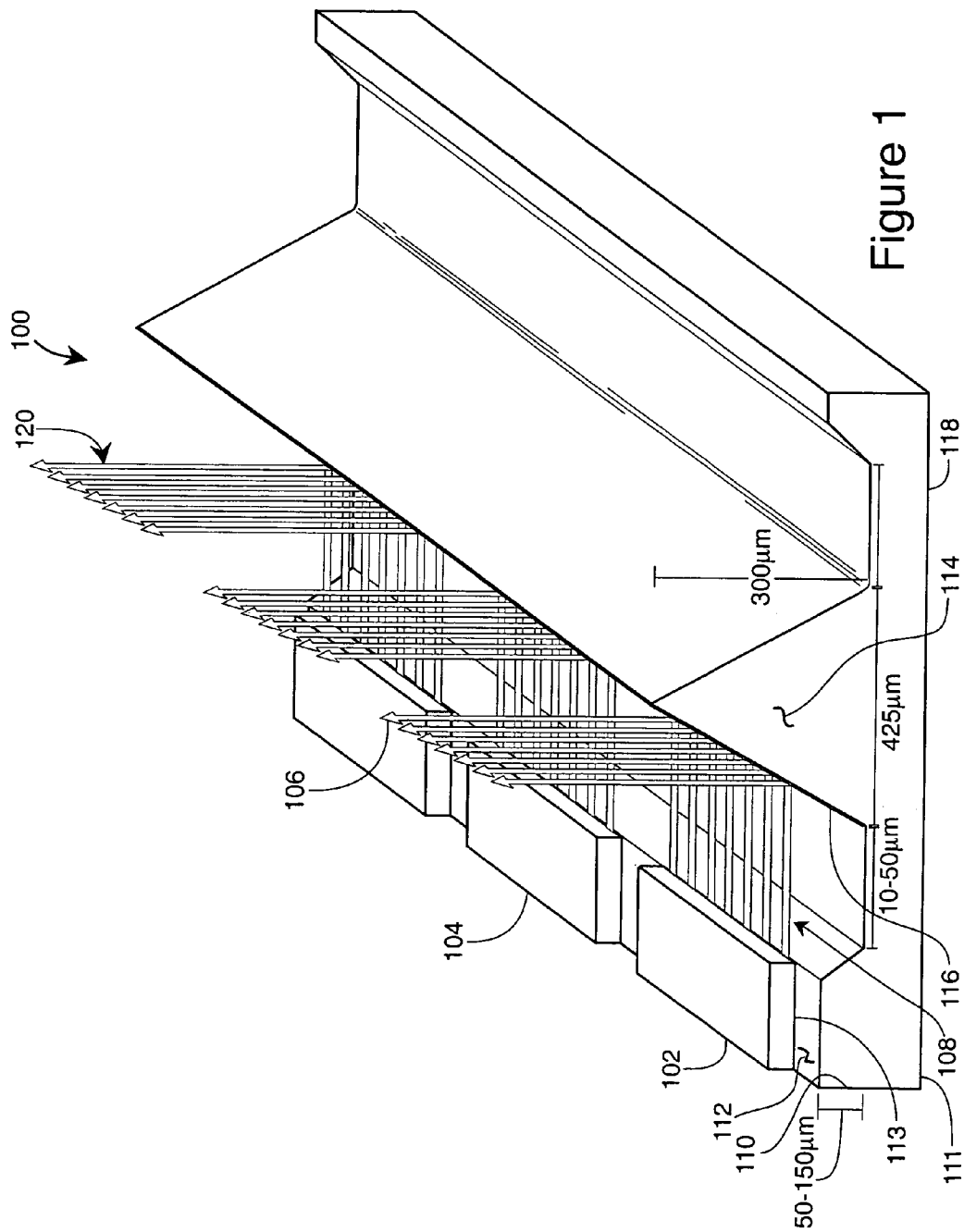
FIG. 1 shows a perspective view of a single pattern Integrated Diamond Carrier with laser diode arrays.

It is contemplated that alternative methods and fabrication materials may be employed to fabricate Integrated Diamond Carriers according to the present invention. It is also contemplated that Integrated Diamond Carriers according to the present invention can be utilized in a variety of packages for a variety of devices and modules in addition to lasers. For example, Integrated Diamond Carriers according to the present invention may employ mold or template fabrication materials other than silicon and may be utilized in the packaging of MicroElectro Mechanical Systems (MEMS) and Micro Optical Electro Mechanical Systems (MOEMS) devices, particularly where such devices can benefit from carriers customized to particular applications. Integrated Diamond Carriers according to the invention may also find use in the mounting and cooling of semiconductor devices particularly power semiconductor devices and semiconductor devices employing optical input or output communication paths.

Additionally it is noted that terms such as "preferably," "commonly,", "essentially," "critically," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the invention. Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the invention is not necessarily limited to these preferred aspects.

The Integrated Diamond Carrier of the present invention may be described as a freestanding diamond baseplate or carrier consisting of an array of mesa structures for mounting solid state (e.g. GaAs) laser bars and mirrors for steering the generated laser light. The Integrated Diamond Carrier is formed by conformally growing diamond on a patterned substrate of for example Silicon that serves as a mold or template. The substrate is etched away leaving the freestanding diamond carrier. The conformal growth of diamond is important to the successful fabrication of the Integrated Diamond Carrier. For this we prefer a modified version of a novel nucleation method, as is disclosed in the U.S. patent application of S. Z. Rotter, one of the inventors of the present invention, in an application titled "Method of Surface Processing in Preparation for Thin Film Coatings" identified with U.S. Ser. No. 09/580,230 and filed on May 28, 2000. The contents of this application are also hereby incorporated by reference herein. The Rotter process has been found to fabricate diamond films having desirable conformality. Other techniques for conformally coating diamond may also be used.

FIG. 1 in the drawings shows a simplified Integrated Diamond Carrier assembly 100 according to the present invention in a simulated three-dimensional view. In the FIG. 1 drawing there appears an Integrated Diamond Carrier 110 on which is mounted three laser bar assemblies 102, 104 and 106 that are disposed in close lateral adjacency. Each of the laser bar assemblies 102, 104 and 106 generates a plurality of light output beams 108, one beam from each of the solid state or diode laser devices located in the bar assembly. These output beams are generally disposed in a common plane and aimed in a common direction. The number of lasers in each of the laser bar assemblies may of course vary as may the number of and the size of the laser bar assembly itself.

Light beams generated in the laser bar assemblies are shown in FIG. 1 to impinge on a reflective surface 116 disposed on an optical element such as the prism 114 made as a part of the pattern of the Integrated Diamond Carrier 110. Laser beams reflected from the surface 116 are directed away from the FIG. 1 assembly as shown at 120 for collection into a higher energy beam and utilization. The integral nature of the prism 114 is a significant aspect of the present invention in that the shape and dimensions of the FIG. 1 assembly can be established and maintained with a significant degree of precision and long term predictability. The Integrated Diamond Carrier 110 and the prism 114 are integral with each other and are preferably made from chemical vapor deposition-formed diamond materials as disclosed previously and in successive parts of the present document. This diamond provides good physical stability and the high thermal conductivity desired in the FIG. 1 structure.

The laser bar elements 102, 104 and 106 are shown in FIG. 1 to be mounted on a mesa pedestal portion 111 of the Integrated Diamond Carrier 110 in order to cause the output beams of the arrays to impinge on a central portion of the prism reflecting surface 116 notwithstanding a reasonable degree of output beam angular displacement in the FIG. 1 vertical and horizontal directions and to accommodate small non horizontal components in the surface of the mesa pedestal at 112. Other arrangements of these interrelated details are clearly possible and within the realm of choice to a designer.

It is notable in the FIG. 1 drawing that the output beams from the laser bar elements 102, 104 and 106 originate from a near bottom surface region of the packages of the elements 102, 104 and 106. This arrangement is intentional in the FIG. 1 assembly and occurs by way of the laser bar elements 102, 104 and 106 being mounted in what may be described as an upside down or "P side down" or "face down" configuration. This configuration is desirable in order to place the laser components of the bar array elements 102, 104 and 106 as close as possible to the receiving surface 112 of the Integrated Diamond Carrier 110. Such location minimizes the length of the thermal path from the laser diode components through laser semiconductor layers into the heat sinking and heat communicating material of the Integrated Diamond Carrier 110.

In addition it is desirable for a thin layer of material such as an adhesion layer of Titanium/Gold of about 100 nanometers thickness and an overlying layer of Indium of about one to ten microns thickness to be applied to the pedestal or mesa 111 receiving surface 112 in order to both better retain the laser bar assemblies 102, 104 and 106 against removal forces and to enhance the thermal path integrity between laser and diamond material. The Indium film used may have a nominal thickness near three micrometers and may be applied during the chemical vapor deposition sequence for the FIG. 1 assembly.

Other details relating to the Integrated Diamond Carrier 110 also appear in the FIG. 1 drawing, these details include the dimensions in micrometers that are representative of features in a typical embodiment of the invention. These dimensions are of course not critical and are shown for example rather than for limiting purposes. Additionally appearing in the FIG. 1 drawing is the generally rough planar surface 118 of the backside area of the Integrated Diamond Carrier 110. This surface may be exposed to a source of liquid or vapor cooling or phase change cooling or possibly to metallic thermal conductors in order to convey laser heat from the FIG. 1 assembly. Clearly some consideration is needed with respect to the nature of the thermal media involved with this backside surface 118 in order for it to be in keeping with the low thermal resistance achieved within the FIG. 1 assembly itself.

Fabrication of the FIG. 1 assembly has been said herein to be preferably accomplished using the assistance of a mold or jig that may be for example made of a semiconductor material, a material readily processed to form the FIG. 1 shapes via use of the photoresist, etching, and other processes employed to fabricate integrated circuits. These processes are in fact determinative of shapes appearing in the FIG. 1 embodiment of the Integrated Diamond Carrier invention. The angles appearing in the prism 114 in FIG. 1, including the angle at which the surface 116 is disposed, is in fact most readily achieved through observance of the crystal properties of the for example Silicon material used in the mold or substrate forming the FIG. 1 diamond assembly. Additional dimensional details of the FIG. 1 assembly appear in the FIG. 3 drawing; details of the Integrated Diamond Carrier fabrication process appear below.

Figure 2:
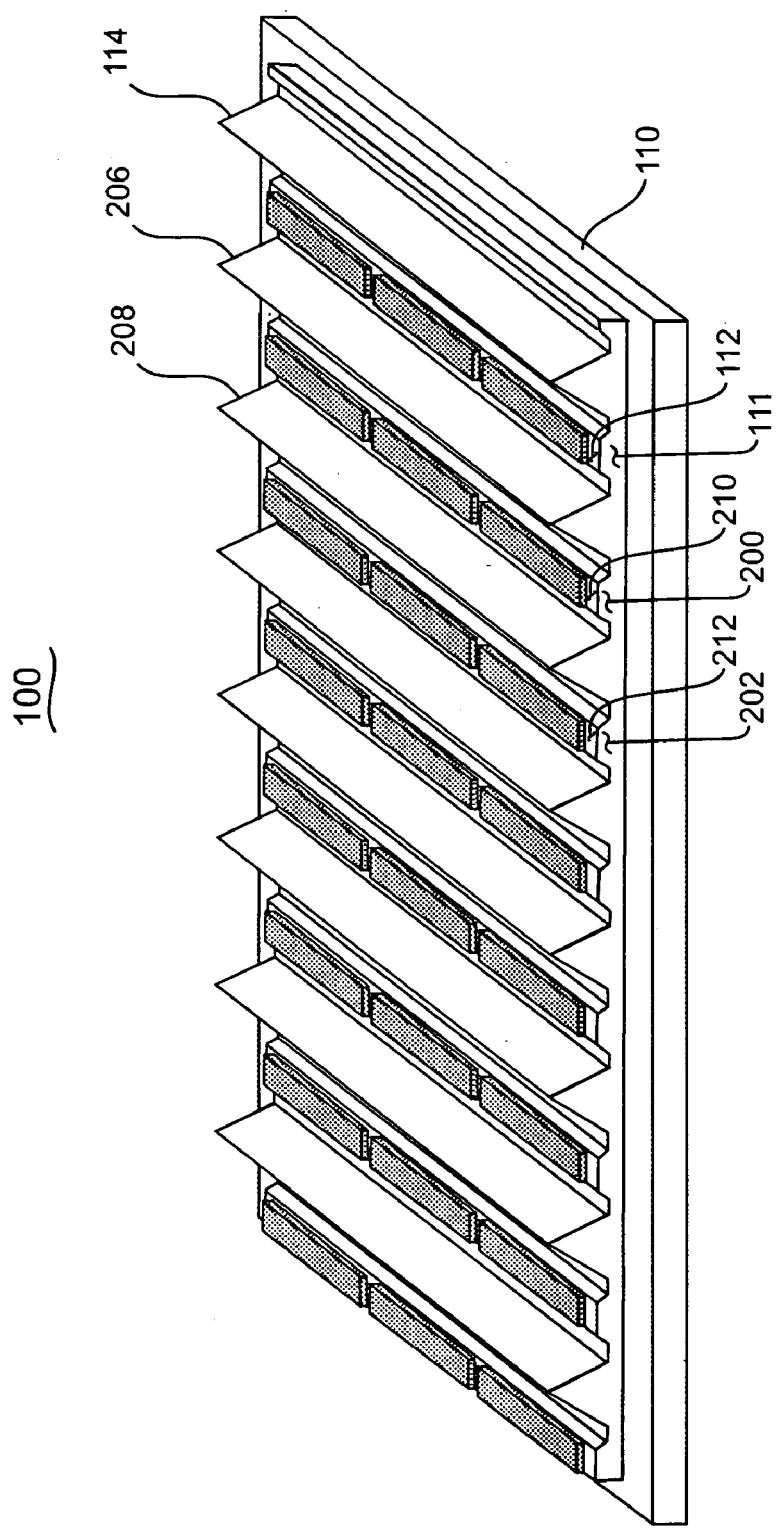
FIG. 2 shows an assembly of FIG. 1 Integrated Diamond Carriers.

FIG. 2 in the drawings shows the appearance of a somewhat practical embodiment of the Integrated Diamond Carrier, an embodiment providing for use of a greater number of laser bar assemblies such as shown at 102, 104 and 106 in FIG. 1 in for example a higher power laser pumping arrangement. The FIG. 2 Integrated Diamond Carrier is in fact shown to be of eight-row capacity or eight times the size of the FIG. 1 Integrated Diamond Carrier.

Growing an Integrated Diamond Carrier

Figure 3:
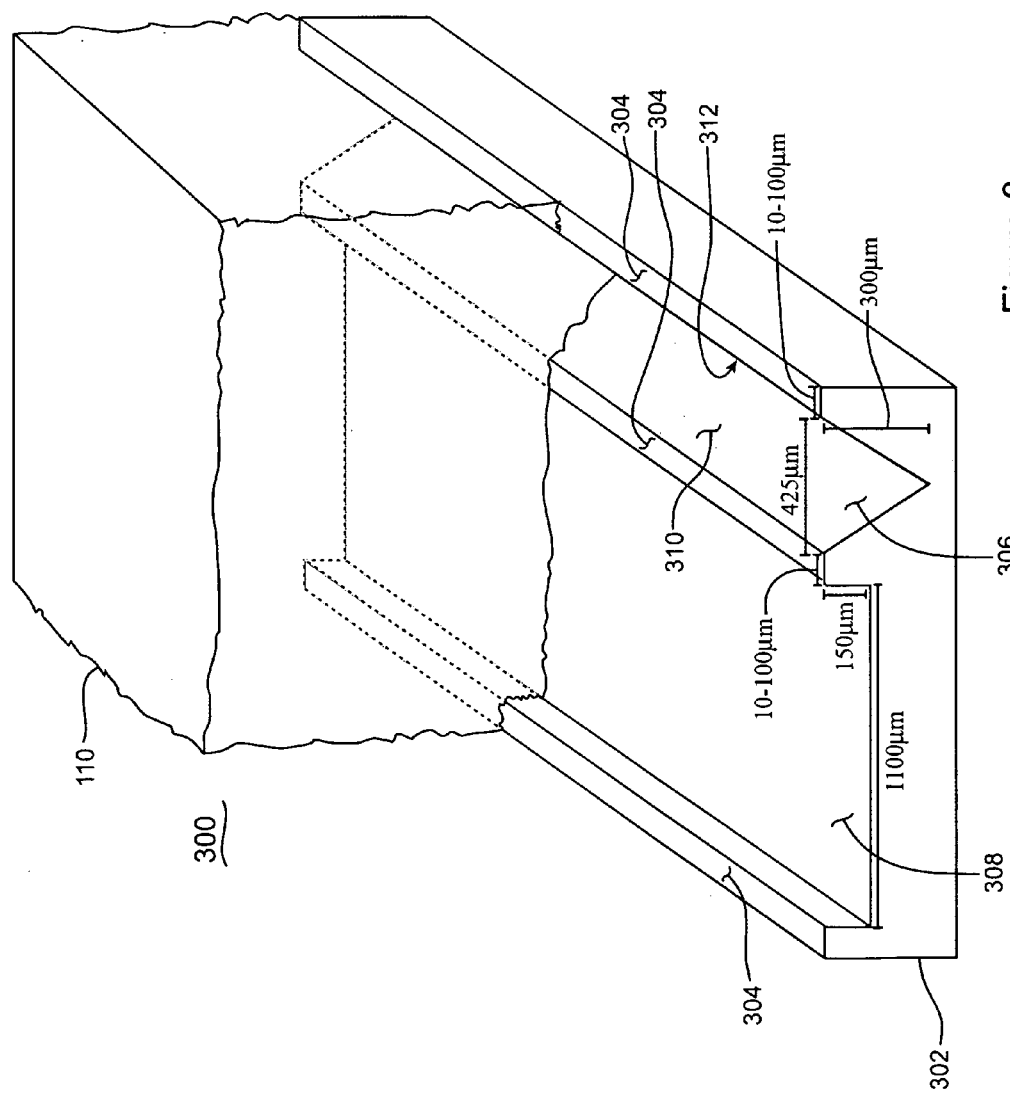
FIG. 3 shows an Integrated Diamond Carrier fabrication mold or template.

In order to fabricate an Integrated Diamond Carrier according to the present invention a sequence of steps such as described in the following paragraphs may be used. Alternate steps are included in these descriptions and taken together with the recited preferred steps may be understood to comprise a plurality of examples of fabricating Integrated Diamond Carriers. A first step in these examples is to fabricate a patterned substrate to serve as a "mold" from which the shape of the Integrated Diamond Carriers can be conformally grown. Preferably the substrate "mold" is formed from a single crystal silicon wafer using conventional photolithography lift off techniques. Photolithography masks can be accomplished to create the inverse patterns of both the mesa structures for mounting the laser bars and the pyramidal mirror structures. FIG. 3 in the drawings shows details of a single Integrated Diamond Carrier mold created by way of such mask procedures. The patterned molds can be fabricated from other materials including, but not limited to silicon, silicon dioxide, aluminum nitride, quartz, sapphire, titanium, copper. Other procedures including, but not limited to negative or positive photolithographic mask techniques using chemical wet etching and (deep) reactive ion etching, and laser patterning may also be used to achieve the FIG. 3 type of mold. The following examples of achieving patterns for IDC mold illustrate in more detail some of the possible variations.

Example 1

A silicon pattern having a 1100 micrometer wide flat trench of 150 micrometers depth formed by deep reactive ion etching and disposed so that the v-groove laser bar assemblies mesa begins 100 micrometers from the flat trench is achieved in this example; this structure is shown in FIG. 3. A second pattern in the FIG. 3 fabrication sequence produces the v-groove structure of 425 micrometers width at the opening and 300 micrometers depth, to the point of the v-groove, using wet etching (e.g. KOH solution) techniques. The v-groove is derived from the natural stop etch plane of the silicon substrate crystal at the 54.7 degrees of angle of the {111} surface of silicon.

Example 2

A silicon pattern formed using wet etching (KOH solution) techniques to produce a v-groove structure 425 micrometers wide at the opening and 300 micrometers deep as shown in FIG. 3 is repeated across a silicon mold wafer every 1725 micrometers in order to achieve a full wafer complement of molds and a full wafer of Integrated Diamond Carrier structures. (I.e., the Flat trench and v-groove patterns repeat across the silicon wafer in order to fabricate a full wafer complement of molds and Integrated Diamond Carrier structures.) The individual molds in this example appear as in FIG. 3; a multiple collection of these molds, not shown in the drawings, is used.

Example 3

A silicon pattern formed using wet etching (KOH solution) techniques to produce a 2500 micrometer wide flat trench at 50 micrometers deep with side walls at an angle of 54.7 degrees so that the opening is approximately 2640 micrometers wide and aligned so that a v-groove structure begins 10 micrometers from the flat trench is achieved in this example. This second pattern will also produce a v-groove structure 425 micrometers wide at the opening and 300 micrometers deep to the point using wet etching KOH solution techniques. The Flat trench and v-groove patterns are repeated every 3285 micrometers across the silicon wafer. Molds of this configuration accommodate laser bar assemblies of differing physical and electrical size and differing output and heat loss characteristics than have been described heretofore herein.

Example 4

A machined mold or a reproduction of a master machined mold may also be used to accomplish the function of the FIG. 3 mold. Such a mold of course excludes the favored {111} or other crystal plane feature of the FIG. 3 mold and thus may provide any angular shape desired for the illustrated pyramidal mirror element. Such a mold may also need differing mold removal reagents in comparison with molds made of silicon or other semiconductor materials. The polishing, plating and other surface preparation steps contemplated for the surface of the silicon semiconductor mold also require change or adjustment in accommodation of the possibly metal or other mold fabrication material and the degree of optical surface quality achieved as a result of the machining operation. With the greater freedom of light diverting element shape achievable with such a non semiconductor mold the possibility of a refractive rather than reflective diverting of the laser beams is possible. One or more of the silicon dioxide, aluminum nitride, quartz, sapphire, titanium, copper and other mold materials disclosed above may be used with molds made by such machining or other non semiconductor etching achieved molds.

Once a mold is achieved in one of these manners the desired Integrated Diamond Carrier can be made using a planar fabrication process in order to produce a patterned freestanding integral diamond structure consisting of both mesa elements for mounting solid state laser bars and diverter elements for directing the light emitted by the edge emitting laser bars. The integral diamond structure may receive for example gallium arsenide laser assemblies. The integral light diverters are pyramidal structures of the same diamond material as that composing the remainder of the Integrated Diamond Carrier. This patterned freestanding integral diamond structure is formed by conformally growing diamond on the patterned substrate serving as a mold. Once the conformal diamond film is grown to the desired thickness (ranging from 50 to 3000 micrometers), the patterned substrate is etched away leaving the freestanding diamond structure.

The chemical vapor deposited (CVD) diamond contemplated for the Integrated Diamond Carrier of the present invention, and diamond in general, are naturally highly chemically resistant so that regardless of the etch technique and mold materials used, the mold substrate can be removed without significantly affecting the diamond or its form as long as temperatures remain below 1000 degrees Celsius. For example a silicon substrate for a Integrated Diamond Carrier may be removed using a solution of hydrofluoric acid (HF), nitric acid ($HNO_3$) and acetic acid ($CH_3COOH$) at a ratio of HF:HNO$_3$:CH$_3$COOH=3:5:3. Alternatively, a silicon dioxide substrate can be removed using a commercial buffered oxide etch solution.

Prior to growing the diamond film on the patterned substrate, the substrate may be (1) cleaned with common solvents (such as acetone, methanol, isopropyl alcohol, ethanol) and rinsed with de-ionized water. Alternately, (2) when using the silicon patterned substrates the substrate may be cleaned with common solvents and a thin layer of oxide (e.g. SiO$_x$) formed on the silicon by heating to 900 degrees Celsius in an oxygen atmosphere, then just prior to inserting the sample into the diamond deposition chamber, the oxide layer removed (using either a brief hydrofluoric acid or buffered oxide etch) and the substrate rinsed with de-ionized water. The purpose of the surface oxidation is to remove from the substrate any adventitious carbon or other materials that are not removed with a simple solvent cleaning. A light oxygen plasma etch can be used to serve the same function.

The conformal growth of diamond is desirable for the successful fabrication of the Integrated Diamond Carrier. For this we need a controlled growth process that allows for very dense interface of the diamond and the substrate pattern as well as for a very smooth interface, especially for fabricating the mirrors. The smoothness of the interface and hence, the surface of the Integrated Diamond Carrier is a function of both the quality and smoothness of the substrate pattern and the control of the diamond nucleation and growth process at the interface. The Integrated Diamond Carrier surface requires very smooth surfaces to facilitate mounting of the laser bars, to achieve uniformity of the temperature across the laser bars, to control temperature gradients in the array (this relates to the heat spreading capability of the Integrated Diamond Carrier) and to minimize the amount of light lost by scattering from the mirror structures.

Figure 4:
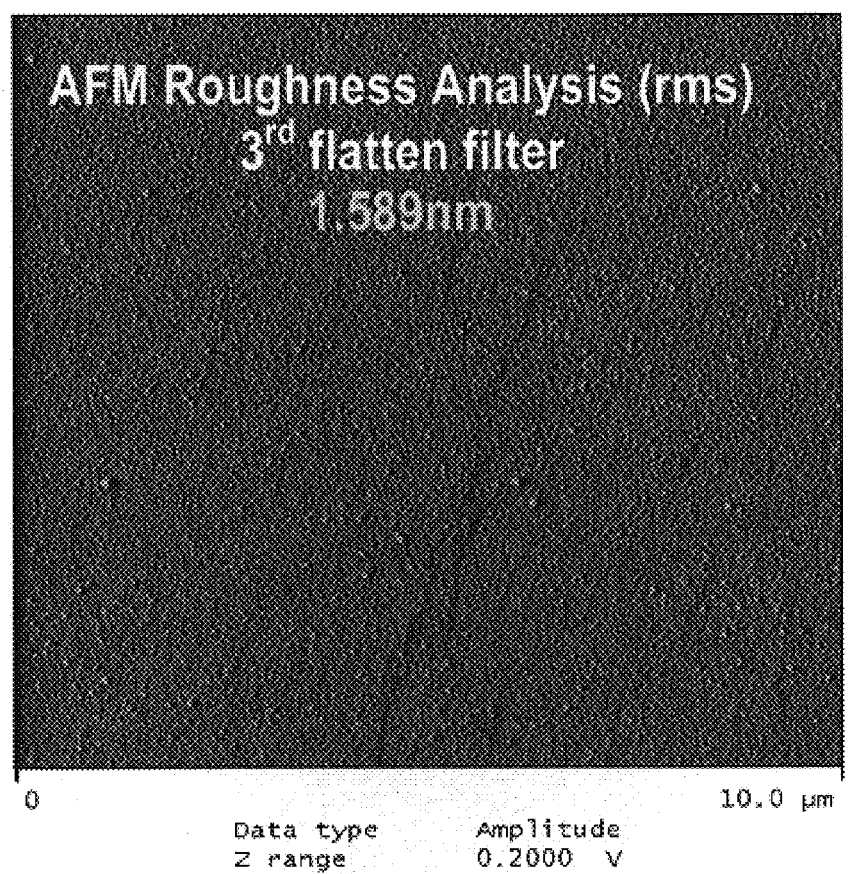
FIG. 4 shows surface roughness details of a Integrated Diamond Carrier deflecting element mold.
Figure 5:
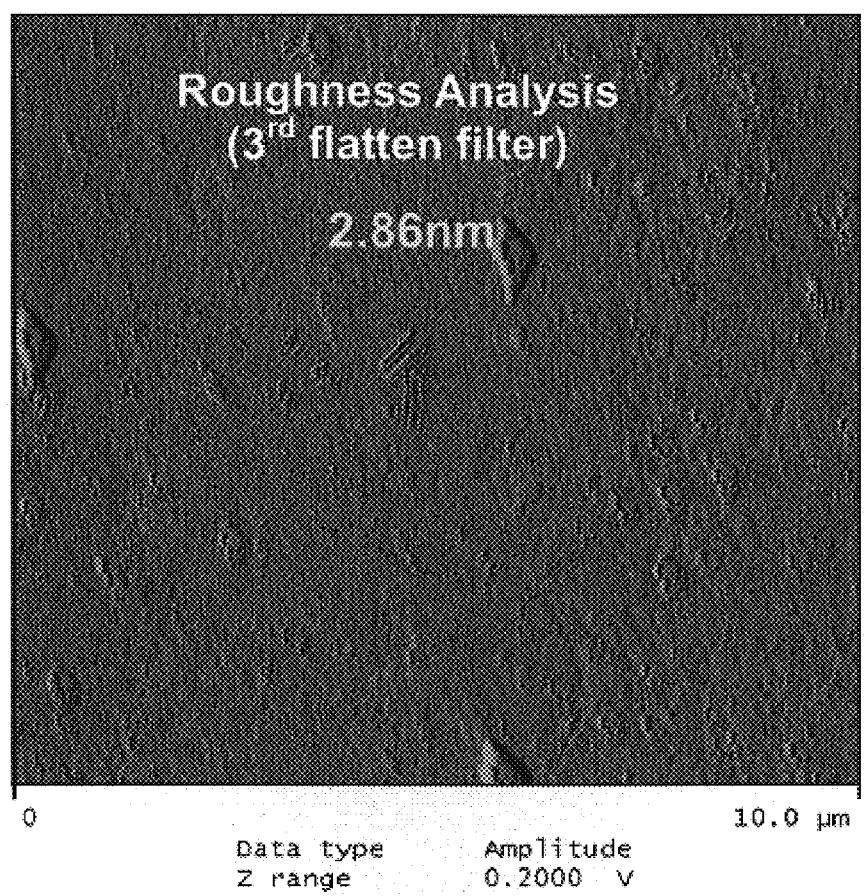
FIG. 5 shows an example of surface roughness details of a Integrated Diamond Carrier deflecting element surface.
Figure 6:
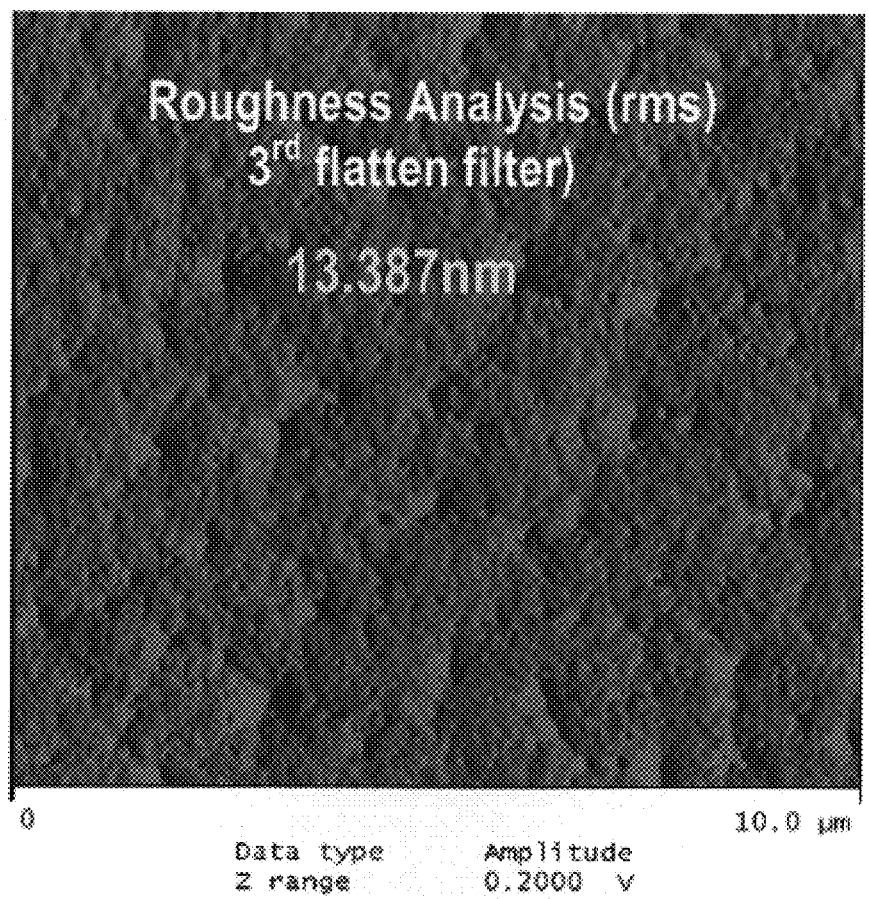
FIG. 6 shows an example of surface roughness details for a laser bonding pad portion of an Integrated Diamond Carrier.
Figure 7:
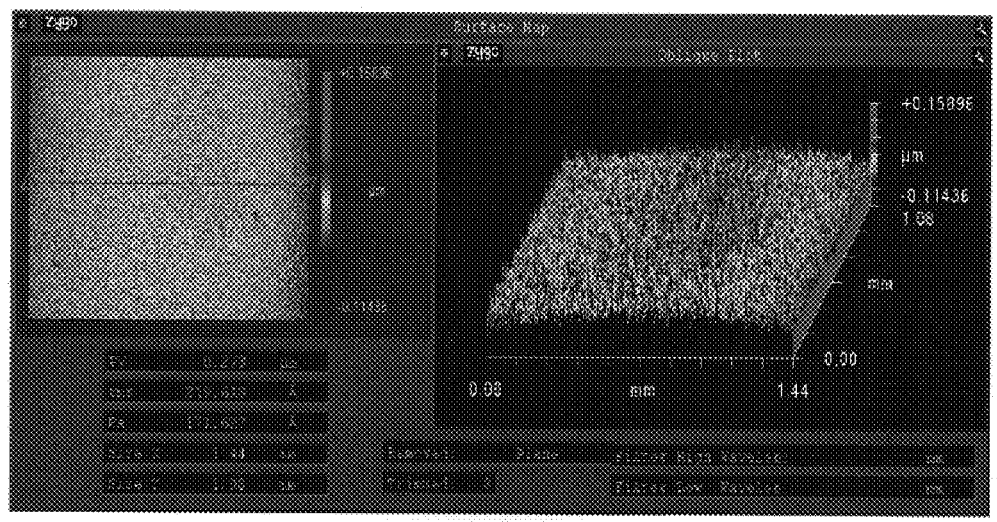
FIG. 7 shows an additional example of surface roughness details and curvature for a laser bonding pad portion of an Integrated Diamond Carrier.
Figure 8A:
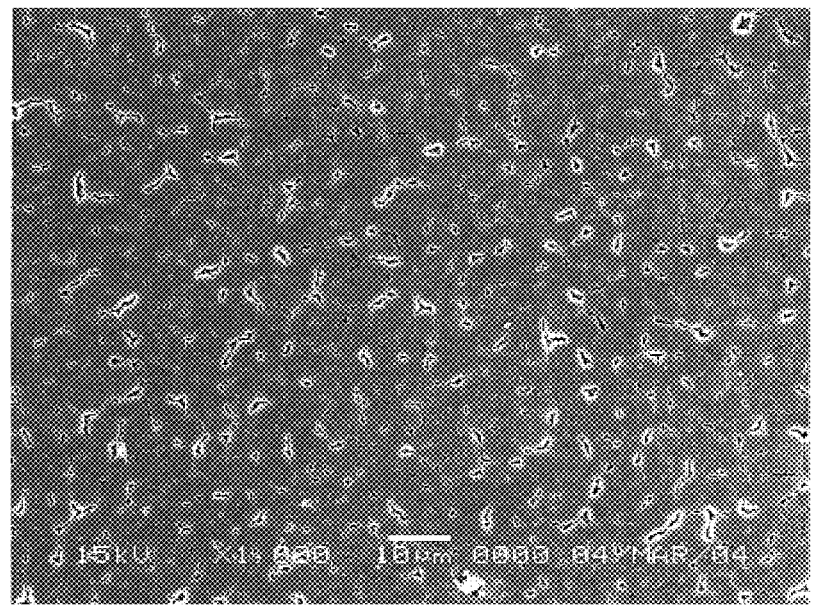
FIG. 8a shows an Integrated Diamond Carrier surface achievable with a conventional processing arrangement in a low magnification.
Figure 8B:
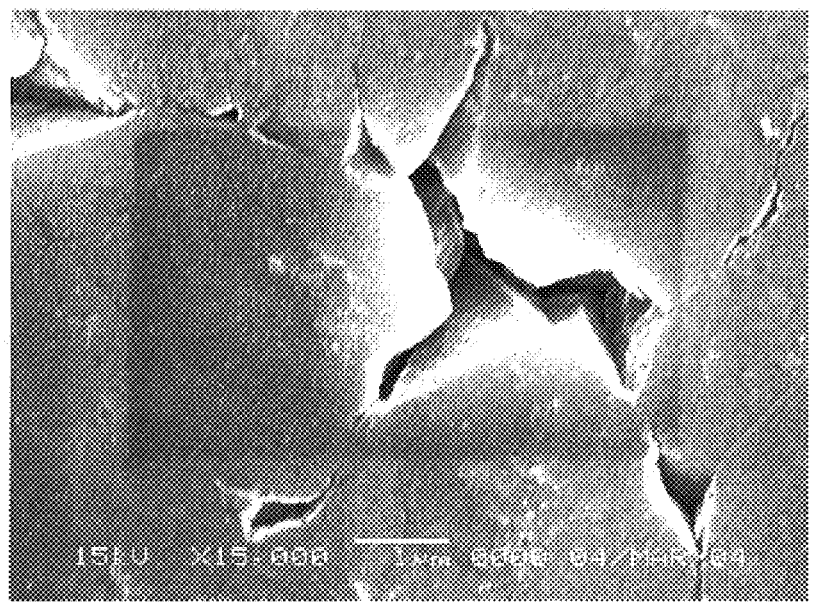
FIG. 8b shows the FIG. 8a Integrated Diamond Carrier surface with greater magnification.

FIG. 4 in the drawings shows a processed atomic force microscopy image of the surface of the v-groove trench in an achieved silicon pattern. The root mean square roughness appearing in the FIG. 4 photograph is on the order of 1.6 nanometers. FIG. 5 shows a similarly processed atomic force microscopy image of the surface roughness of the resulting pyramidal structure of the Integrated Diamond Carrier. The root mean square roughness in FIG. 5 is on the order of 2.9 nanometers. The surface roughness of the flat mesa structure depends largely on the etch technique used during formation of the mold silicon pattern. Using deep reactive ion etching a surface roughness between 10 and 220 nanometers and a curvature on the order of $1.5 \times 10^{-6}$ micrometers$^{-1}$ can be achieved as is shown in the photographs of FIG. 6 and FIG. 7 herein. The FIG. 7 photograph is shown in color in the originally filed application of the present document in view of the detailed information and measuring scales disclosed therein. When surface roughness of the flat mesa structure is critical, then chemical etch such as with KOH or laser-etching procedures may be employed for this surface. Chemical etching results in a surface roughness on the order of 2.9 nanometers. The surface roughness of the IDC is between 2 and 250 nanometers depending on the procedures used to pattern the substrate "mold".

A controlled growth process may be used to obtain a very dense diamond film at the diamond/substrate interface while growing an Integrated Diamond Carrier according to the present invention. This process may be a modified and improved version of the process disclosed by an inventor also named with respect to the present patent document i.e., one Dr. Shlomo Rotter, in the U.S. patent application identified as 09/580,230 and filed on May 28, 2000. This application is hereby incorporated by reference herein. Dr. Rotter's process may be referred-to by the acronym NNP (novel nucleation process).

The NNP process is helpful but not entirely successful in growing the dense interface needed for the present invention Integrated Diamond Carrier. This degree of success may be appreciated from the later discussed photographs appearing in the FIG. 9a and FIG. 9b drawings herein. This partial success may in part be attributed to interaction with the presently preferred plasma assisted microwave chemical vapor deposition system used for diamond growth. Other nucleation and film growth techniques have been described in the literature and may also be suitable for growing the dense conformal diamond coating for the present invention Integrated Diamond Carrier. Following is a description of what we call the modified novel nucleation process (or MNNP). The modified novel nucleation process is a three-step sequence for achieving a high nucleation rate of diamond on a multitude of substrates and obtaining a dense smooth interface.

The growth sequences described in this document may accomplished in an apparatus such as the Astex 5 KW Microwave High Growth Chemical Vapor Deposition Diamond System, a system operating at a microwave frequency of 2.45 gigahertz. Alternately a hot filament reactor growth chamber apparatus using a rod array filament, an apparatus known in the deposition art may be used.

Step 1 in the modified novel nucleation process is referred to as a pretreatment step. In this step the cleaned substrate is inserted into a deposition chamber and exposed to what is referred to as "growth conditions" for a period of time ranging from 10 to 90 minutes. Typically this time can be between 30 and 60 minutes. Growth conditions are relatively arbitrary at this stage. Such conditions are simply those conditions for which using any particular diamond deposition technique, e.g. such as hot filament, microwave chemical vapor deposition and so-on, one would normally expect to grow diamond on a properly seeded sample. In fact the pretreatment step may be performed at any range of growth conditions, and in almost any type of diamond reactor, and yet achieve the desired effect; the effect of producing a 5 to 10 nanometer thick film of carbonaceous material serving as a uniform adhesion layer for diamond seeding during step 2. Ellipsometry measurements suggest that the desired film has the same optical constant as diamond.

Using microwave chemical vapor deposition, MWCVD, and 2.45 Ghz continuous wave microwave energy, typical pretreatment conditions can be in the following ranges:

A hydrogen flow rate of 400-900 sccm,

A methane flow rate of 1-9 sccm,

The ratio of methane to hydrogen gas flow rates not to exceed 2%,

An input Power level of 1500 to 4000 Watts,

A pressure of 20 to 120 Torr,

A Temperature of 500 to 900 degrees Celsius.

Step 2 is referred to as the seeding step. In this step, the pretreated sample is suspended loosely from a corner into a suspension of nanodiamond powder and ethanol that is continuously agitated ultrasonically. The preferred nanodiamond powder is produced by a common detonation processes. The average crystal size is 5 nanometers and average grain size is 20-50 nanometers. In powder form the material does agglomerate to sizes that exceed 1 micron. A typical preferred nanopowder solution consists of 2 grams of the described diamond nanopowder in 200 milliliters of ethanol. The solution is agitated for several minutes in the ultrasonic bath prior to suspending the pretreated substrate completely into the suspension. The substrate should be held vertically but be allowed to move freely in the suspension to obtain the most uniform seeding. Seeding time ranges from 10 to 90 minutes; typical times range from 15 to 30 minutes. After seeding for the desired length of time the sample is removed from the solution, initially rinsed in ethanol and placed in an ultrasonic bath of pure ethanol for 2-5 minutes. Finally the sample is removed, initially rinsed in de-ionized water and placed in a ultrasonic bath of de-ionized water for 2 to 5 minutes; then the moisture is removed from the surface by blowing the sample dry with compressed dry nitrogen. Alternatively, to rinsing in an ultrasonic bath, the sample may be rinsed with ethanol and de-ionized water by using a spin coating apparatus.

Several different seeding solutions have also been used successfully to obtain sufficient nucleation sites with this process. Below is disclosed a partial list of these solutions:

Example 1

As described above, 2 grams of nanodiamond powder in 200 ml of ethanol.

Example 2

3.2 grams of 10 micrometer diamond powder in 200 ml of methanol.

Example 3

3.2 grams of 10 micrometer diamond powder in 200 ml of ethanol.

Example 4

2.2 grams of 10 micrometer diamond powder, 1 gram of 0.1 micrometer diamond powder in 200 ml of methanol.

Example 5

2.2 grams of 10 micrometer diamond powder, 1 gram of 0.1 micrometer diamond powder in 200 ml of ethanol.

Example 6

1.6 grams of 10 micrometer diamond powder, 1.6 grams of 0.1 micrometer diamond powder in 200 ml of methanol.

Example 7

1.6 grams of 10 micrometer diamond powder, 1.6 grams of 0.1 micrometer diamond powder in 200 ml of ethanol.

Example 8

1.0 grams of 10 micrometer diamond powder, 2.2 grams of 0.1 micrometer diamond powder in 200 ml of methanol.

Example 9

1.0 grams of 10 micrometer diamond powder, 2.2 grams of 0.1 micrometer diamond powder in 200 ml of ethanol.

Example 10

3.2 grams of 0.1 micrometer diamond powder in 200 ml of methanol.

Example 11

3.2 grams of 0.1 micrometer diamond powder in 200 mL ethanol

Example 12

200 ml of General Electric Company diamond slurry 0-0.2 micrometer diamond formula K-285T.

Example 13

200 ml of South Bay Technology diamond suspension 0.1 micron diamond, P/N DS001-16.

Example 14

200 ml of Warren Superabrasives diamond suspension, 0.5 micrometer diamond, type MB DIA-SOL, Lot 910T-6.

It is desirable that the excess slurry, or suspension diamond material be fully removed from the substrate by rinsing with the appropriate solvents and de-ionized water in order to obtain a very finely seeded surface free of contaminants and large agglomerates of diamond particles. Contaminants and large agglomerates of diamond particles degrade the quality of the interface layer between the substrate and the diamond film, increase the surface roughness at the interface and can result in large gaps between grain boundaries in the film.

Step 3 is referred to as the Growth stage. During this step, the seeded and rinsed sample is placed in a growth chamber and the diamond film of the Integrated Diamond Carrier work piece is grown on the substrate. As a result of steps 1 and 2, immediate film growth occurs. There is no induction period. The density of the grains at the interface and the size of the nondiamond carbon domains is a function of both the seeding process and the initial conditions during the step 3 growth stage. With appropriate choice of growth conditions and seeding parameters, a continuous film develops within 40 to 80 nanometers of thickness with gaps of less than 1 nanometer in size between grains. These gaps are usually domains of non-diamond carbon.

Figure 9A:
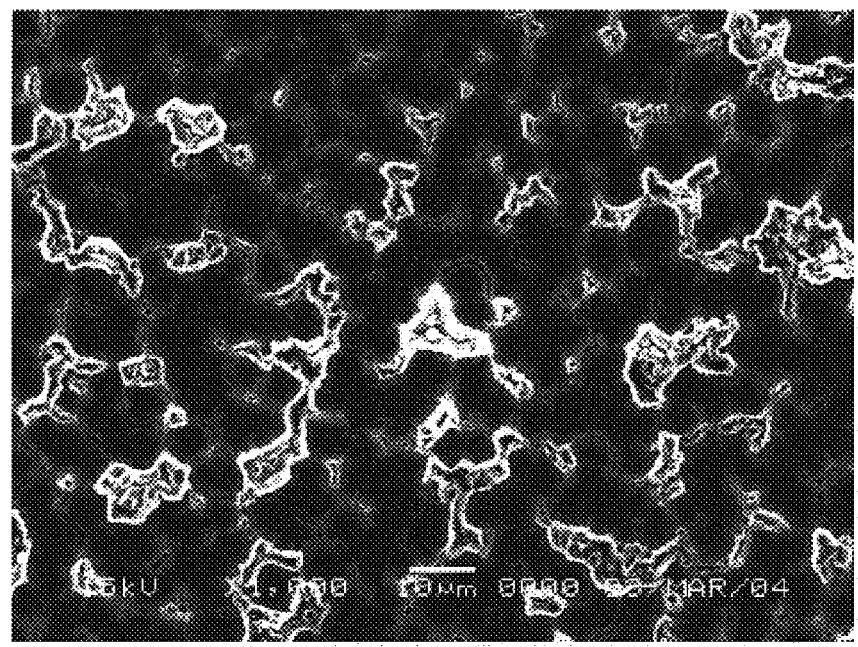
FIG. 9a shows an Integrated Diamond Carrier surface achievable with an alternate processing arrangement in a low magnification.
Figure 9B:
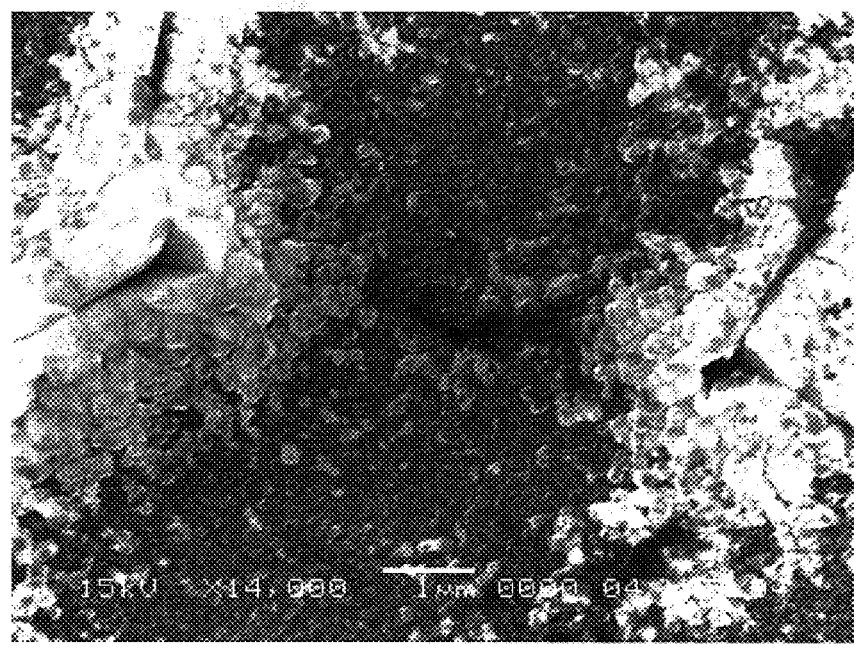
FIG. 9b shows the FIG. 9a Integrated Diamond Carrier surface with greater magnification.
Figure 10A:
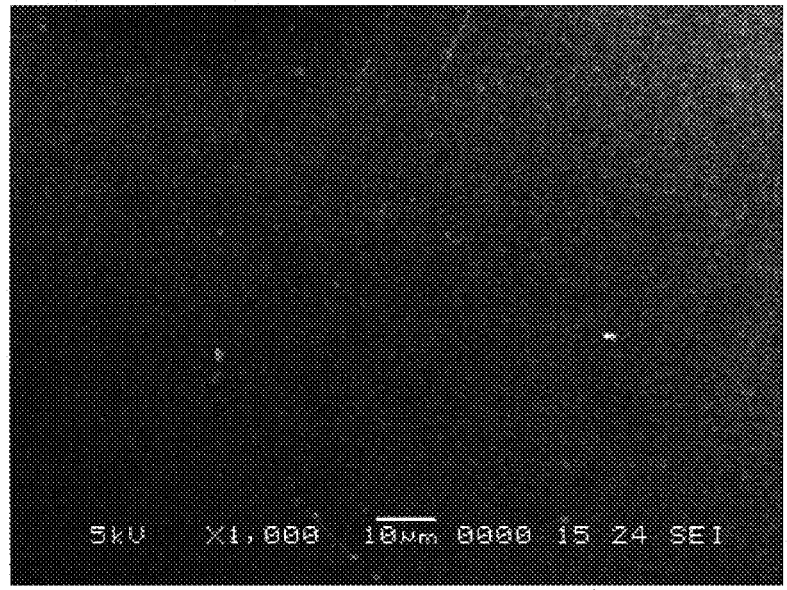
FIG. 10a shows an Integrated Diamond Carrier surface achievable with processing according to the present invention in a low magnification.
Figure 10B:
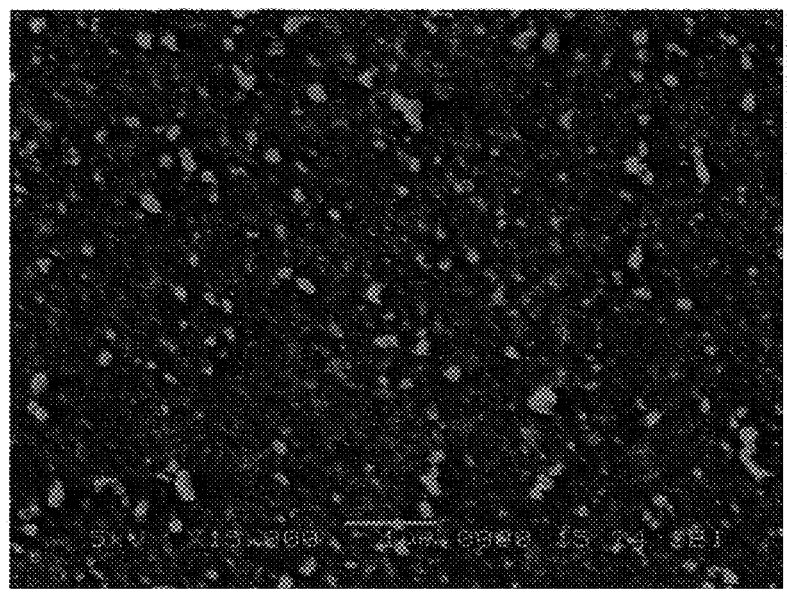
FIG. 10b shows the FIG. 10a Integrated Diamond Carrier surface with greater magnification.

The photographs of FIG. 8a, FIG. 8b, FIG. 9a, FIG. 9b, FIG. 10a and FIG. 10b "drawings" herein illustrate the importance of selecting the appropriate growth and seeding conditions in this process; the FIG. 9a and FIG. 9b photographs in this group relate to the above described process of Dr. Rotter; the drawings of FIG. 10a and FIG. 10b relate to the herein described process and the photographs of FIG. 8a and FIG. 8b relate to a conventional nucleation and deposition sequence. In each of these comparisons the first photograph represents a magnification near 1000 time and the second a magnification near 15,000 times as is indicated in the photographs. These photographs or micrographs are obtained of course from a scanning electron microscope using the acceleration voltage and other parameters and the dimensional scales indicated in the photographs. Additional numerical details regarding scanning electron microscope-obtained images appear below the photograph in several photographs of this document and can be appreciated by persons familiar with such apparatus.

Notably in the FIG. 8 photographs the conventional growth technique diamond grains at the interface are quite large. The surface of the grains is smooth, however, notice that the large grain size at the interface results in large gaps between grains where there exists domains of nondiamond carbon. Note also in the FIG. 9 photographs that not only are there large diamond grains at the interface and large gaps between the grains, but also that the surface of the grains is not smooth.

The surfaces of the larger FIG. 9 grains appear to be covered with much smaller sized grains in a secondary growth that significantly increases the surface roughness.

The FIG. 10 drawings-photographs show micrographs of the interface of diamond fabricated using the presently espoused and above discussed modified novel nucleation process and an initially slower growth rate deposition. Notice that the interface in FIG. 10 is very dense, with no apparent gaps between grains. Surface roughness is minimal, ranging from 3 to 250 nanometers depending on the initial growth conditions and seeding procedures.

Other deposition procedures may be suitable for fabricating a very dense, smooth diamond interface to form the Integrated Diamond Carrier from the patterned substrate. However to obtain the desired very dense diamond interface on the patterned substrate, the modified novel nucleation process is used with initial growth conditions in step 3 that are slow and carefully controlled. The typical growth rate for the first layers of diamond growth in the modified novel nucleation process is 0.3 micrometers per hour. After the dense interface is established the growth conditions can be altered to increase the growth rate, typically to 1-10 micrometers per hour. Higher growth rates are possible. The diamond is then grown to a thickness of 200 micrometers or greater.

Examples of initial growth conditions follow.

Example 15

Hydrogen/methane flow rates of 400/1.2 sccm,
Power of 2000 Watts,
Pressure of 60 Torr,
Temperature of 650 to 720 Celsius,
A growth rate of about 0.3 micrometers/hour.

Example 16

A hydrogen/methane flow rate of 400/2 sccm,
Power of 2300 Watts,
A pressure of 60 Torr,
A Temperature of 650 to 720 Celsius,
A growth rate of about 0.3 micrometers/hour The combination of a lower power level of 1500 to 2500 Watts, a cooled substrate holder and a methane/hydrogen ratio ranging from 0.2-0.5%, yields the lower growth rates and in combination with the seeding process, result in the very dense, smooth diamond interface desired for the formation of the Integrated Diamond Carrier. Initial layers of diamond growth at the low growth rate may range in thickness and, thus in growth time from 1 to 30 micrometers.

Subsequent diamond growth to build up the Integrated Diamond Carrier structure to at least 200 micrometers of thickness may proceed by various techniques. One such technique is by varying the depositions conditions to grade the growth rate into several steps such that an initial growth rate of about 0.3 micrometers/hour is followed by a growth rate of about 0.5 micrometers/hour, a rate of about 0.7 micrometers/hour, a rate of 1.2 micrometers/hour and a rate of about 2.4 micrometers/hour.

Alternatively, the deposition conditions can be varied to obtain an initial growth rate of about 0.3 micrometers/hour, then a rate of about 0.7 micrometers/hour, then a rate of about 1.4 micrometers/hour, and a rate of about 10 micrometers/hour. Varying the growth rates to obtain diamond layers grown at graded growth rates is preferred over arrangements changing abruptly from a very low initial growth rate to a very high growth rate due to differences in film stress occurring in the achieved film. The various growth rates are obtained by increasing the methane/hydrogen ratio, increasing the power level and increasing the chamber pressure as noted in the following examples.

Example 17

A growth rate of about 0.5 micrometers per hour is obtained with a hydrogen/methane flow rate of 400/2.4 sccm, a power of 2300 Watts, a pressure of 60 Torr, and a Temperature of about 730 Celsius.

Example 18

A growth rate of about 0.7 micrometers per hour is obtained with a hydrogen/methane flow rate of 500/4.0 sccm, a power of 2300 Watts, a pressure of 60 Torr, and a Temperature of about 730 to 800 Celsius.

Example 19

A growth rate of about 1.2-micrometers per hour is obtained with a hydrogen/methane flow rate of 500/6.0 sccm, a power of 2500 Watts, a pressure of 65 Torr, and a Temperature of about 720 to 800 Celsius.

Example 20

A growth rate of about 10 micrometers per hour is obtained with a hydrogen/methane flow rate of 800/12.0 sccm, a power of 4000 to 4500 Watts, a pressure of 90 to 120 Torr, and a Temperature of about 750 to 900 Celsius.

Once the diamond film as been built up to a level of 50 to 3000 micrometers thickness, the deposition is discontinued. The sample is allowed to cool and then is removed from the deposition chamber. The substrate is then fully etched using techniques described above, and the single, all diamond carrier consisting of arrays of mesa structures for mounting laser bars, and a series of pyramidal mirrors for directing the light of edge emitting lasers is formed.

Finally a thin metal coating of aluminum or silver can be applied to the mirror side of the pyramidal structures to maximize the reflection of the laser light. Additionally, the mesa structures can be coated with a thin, adhesion layer such as a layers of titanium/gold to facilitate bonding the laser bars to the diamond of the Integrated Diamond Carrier.

The carrier is then ready for mounting of the laser bars. The dimensions of the spaces for the laser bars and the mirrors can be adjusted to optimize the amount of light that is steered into the desired direction and to minimize light losses. The dimensions (width×length) of prototype carriers are such as to facilitate laser performance and different cooling techniques. In this regard it may be noted that the "length" dimension of the laser mounting mesa surface 112 in the FIG. 1 drawing is not specified and that a longer appearing dimension of 1100 um is shown for this feature in the FIG. 3 drawing. In short, these dimensions can be varied to accommodate the details of a suitable thermal management system.

Figure 11:
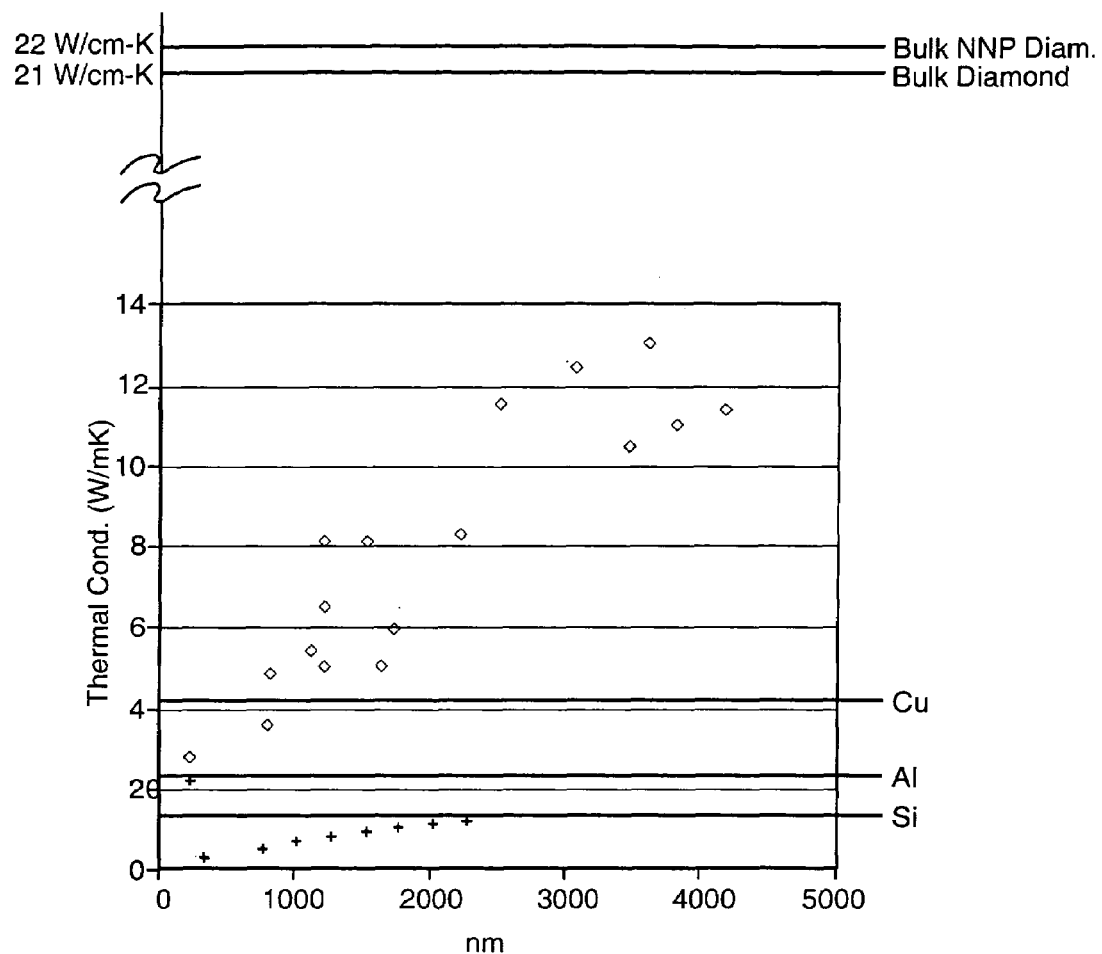
FIG. 11 shows a thermal conductivity comparison involving present invention Integrated Diamond Carrier materials and other thermal conductors.

The laser bars can be densely mounted on the mesa structures of the thusly-fabricated Integrated Diamond Carrier. Notably this Integrated Diamond Carrier is grown as one solid piece of diamond. The light beams emitted from the individual laser bars are aligned parallel to one another in a direction approximately 18 degrees off of vertical from the carrier by the integrated diamond mirrors. The thermal resistance of the diamond carrier is low compared to conventional diode laser carriers (i.e., a value of about 0.001 degree Celsius/Watt for 1 square centimeter, assuming a 200 micrometer thick diamond layer beneath the laser bars) because of the very high thermal conductivity of the diamond. FIG. 11 in the drawings shows a comparison graph of typical thermal conductivity measurements for diamond films and further illustrates advantages achievable with the Integrated Diamond Carrier.

In the FIG. 11 drawing the broken vertical scale on the left ranges in thermal conductivity values between 0 and 22, the latter being a value appropriate for bulk NNP diamond. The horizontal scale in this Figure shows deposited film thickness values ranging from 0 to 5000 nanometers. Along the right hand side of FIG. 11 is identified the materials such as Copper, Silicon and Aluminum providing the thermal conductivity values shown on the left hand scale. The lower curve in the FIG. 11 drawing, the curve represented by the "+" symbols represents thermal conductivity values for thin film copper and the upper diamond shaped curve values represent thin film diamond. Among the points of interest in the FIG. 11 data are the significantly better thermal conductivity of diamond with respect to that of the frequently used copper material in either thin film or bulk form and the fact that thin films of both copper and diamond have differing thermal conductivity values from those of bulk samples of the same material. It is notable also in FIG. 11 that the diamond shaped conductivity points in the center portion of the FIG. 11 drawing represent differing diamond thin film thermal conductivities and these conductivities approach the bulk diamond conductivity as thicker films are considered. Since the diamond film of the present Integrated Diamond Carrier is contemplated to be of 50,000 nanometers or greater thickness it may be observed from the FIG. 11 data that thermal conductivity values near the high bulk diamond value are reasonably incurred in the Integrated Diamond Carrier.

In the Integrated Diamond Carrier the laser bars are preferably mounted with their top surfaces facing down so that the lasing region is closer to the diamond mesa. Indium is a preferred mounting material however other materials may be used. Between the heat source in the lasing region of the laser bar and the diamond carrier in this mounting arrangement is approximately 5 microns of laser bar material (e.g. GaAs) and 3 microns of bonding material (e.g. indium). Assuming a high power laser system with 1000 W/sq.cm of heat to be dissipated, the temperature gradient in the diamond carrier will be only 1 degree Celsius and the temperature gradient from the laser bars to the heat sink will be less than 10 degrees Celsius. The thermal resistance of the described arrangement is almost 50 times lower than the most advanced laser packaging, the silicon monolithic microchannel developed by The Lawrence Livermore National Laboratory LLNL.

Figure 12A:
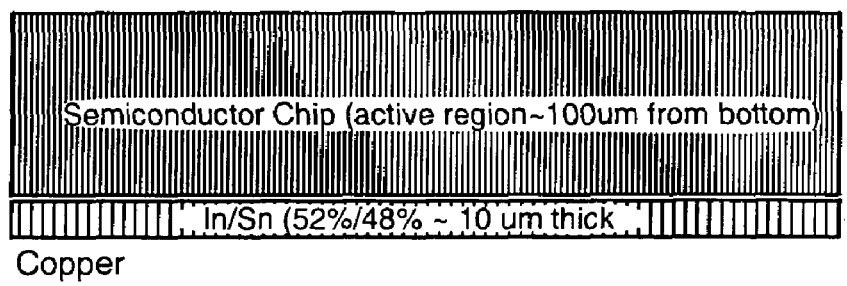
FIG. 12a shows a first thermal path arrangement for a comparison of the present invention.
Figure 12B:
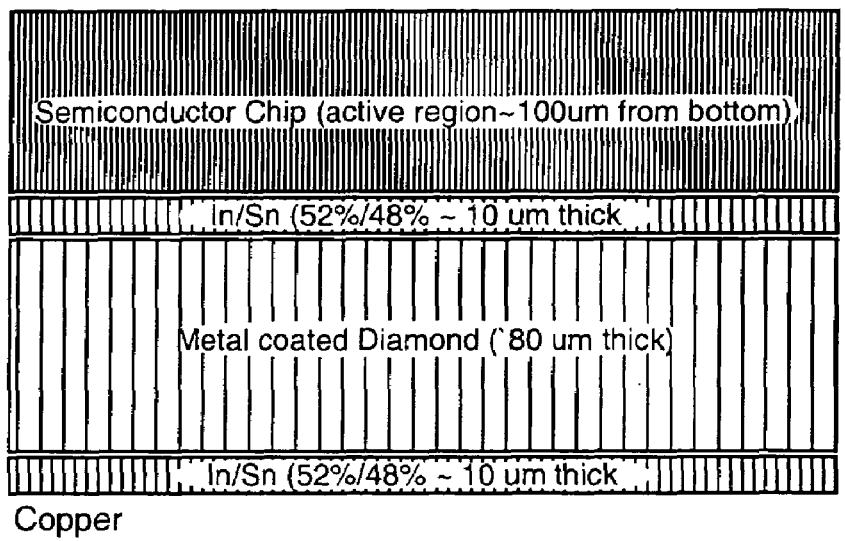
FIG. 12b shows a second thermal path arrangement for comparison of the present invention.

FIG. 12 in the drawings includes the views of FIG. 12a and FIG. 12b and shows an experimental arrangement usable to demonstrate improved laser diode performance with the Integrated Diamond Carrier of the present invention. For this demonstration lasers may be fabricated from single quantum well AlGaAs having graded index. These devices may be mounted with p-side up for this demonstration notwithstanding the advantages of p-side down mounting described earlier. Mounting in FIG. 12a is to a copper CT-type mount using about 10 micrometer thick In/Sn (52%/48%) solder (in the top, no heat spreader, view) or in FIG. 12b to metal of a 1 micrometer Ti/Au) coated Integrated Diamond Carrier of about 80 micrometers thickness using about 10 micrometers thick In/Sn (52%/48%) solder and then mounting to the copper CT-type mount with an additional 10 micrometers thickness of In/Sn (60%/40%) solder.

With no active cooling and no facet coatings of the two FIG. 12 lasers the thermal path from the active region of the topmost laser for the FIG. 12a condition "no heat spreader" is through approximately 100 micrometers of GaAs substrate, about 10 micrometers of In/Sn solder to the copper heat sink. The thermal path from the active region of the laser for the FIG. 12b condition "diamond heat spreader" is considerably longer and through approximately 100 micrometers of GaAs substrate, about 10 micrometers of In/Sn solder, about 80 micrometers of diamond, about 1 micrometer of Ti/Au adhesion layer and about 10 micrometers of In/Sn solder to the copper heat sink. Notwithstanding the longer extent of the FIG. 12b thermal path however, the path involving the Integrated Diamond Carrier, the rollover current for the laser is increased by use of the Integrated Diamond Carrier mounting. A rollover event, as occurs in the FIG. 13 drawings, indicates the occurrence of excessive operating temperature in a diode laser thus increased input power level to a laser prior to rollover occurrence is desirable.

Figure 13A:
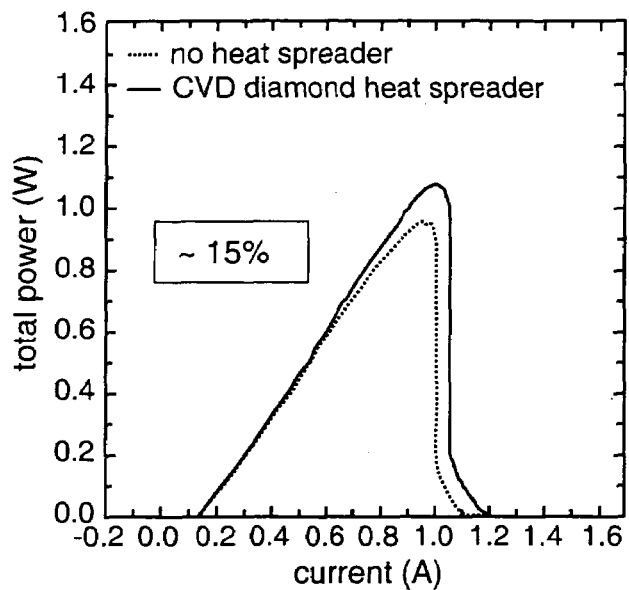
FIG. 13a shows a comparison of thermal cooling capability for an 808 nm Broad Area laser with 60 um ridge widths according to the present invention.
Figure 13B:
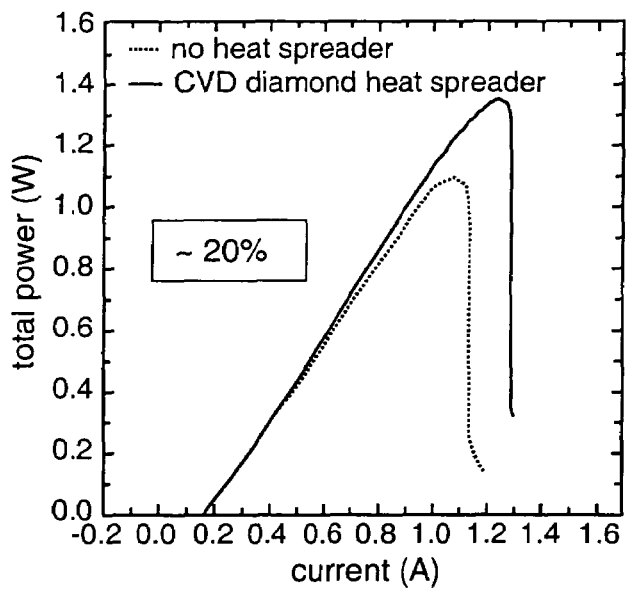
FIG. 13b shows a comparison of thermal cooling capability for an 808 nm Broad Area laser with 80 μm ridge widths according to the present invention.

FIG. 13 in the drawings includes the views of FIG. 13a, and FIG. 13b and shows a comparison of diode laser rollover event occurrences with use of crude laser modules having two different densities of incorporated lasers. In each of these drawings a comparison is made between a non cooled laser and a laser having thermal connection via a ridge of the stated width connected to an Integrated Diamond Carrier. The FIG. 13a drawing shows about a 15% improvement in total output power for 60 micrometer ridge width 808 nm Broad Area lasers. FIG. 13b shows about a 20% improvement in total output power for 80 micrometer ridge width 808 nm Broad Area lasers. These results are typical of the improvements observed in a crude p-side up experiment. With a preferred p-side down mounting configuration, the shorter thermal path through the laser bar (on the order of 5 micrometers as opposed to the p-side up example which is on the order of 100 micrometers) will result in even greater improvements in the laser performance because the thermal resistance essentially scales with the length of the thermal path (hence about a 20× reduction results) through a given material."

In other words, the semiconductor active region is 20× closer to the diamond so the heat generated as that much less material to travel through before reaching the diamond. So the diamond heat spreader Integrated Diamond Carrier can remove the heat from the source faster because the source will be closer to the heat spreader. The active region of the laser bars thus stays cooler and significantly higher rollover current is achievable than in the p-side up configuration.

The present Integrated Diamond Carrier is contemplated to be an integral part of an efficient thermal management system for diode laser arrays (a part that is suitable for use with spray cooling, jets, single phase cooling and other cooling techniques). The very same lasers that are bound to a certain operating power level today, because of limitations in the heat dissipation capabilities of existing carriers, can be operated at much higher power levels using the Integrated Diamond Carrier. The Integrated Diamond Carrier enables lasers to be operated at higher powers, provides a more uniform temperature field for laser bars and longer lifetimes because of the greatly improved cooling efficiency. The carrier will be more robust, less costly to fabricate and as much as 50× more efficient than the most cutting edge technology in diode laser packaging currently existing. The integrated beam steering mirrors of the Integrated Diamond Carrier simplify the process of aligning light from the laser bar arrays.

Advantages

The achieved thermal resistance of the diamond carrier is notably low when compared with that of conventional diode laser carriers, i.e., is about 0.001 degree C/W for a 1 square centimeter thermal path cross section assuming at least a 150 to 200 micrometer thick diamond layer exists beneath the laser bars. This thermal resistance of course occurs because of the very high thermal conductivity of the diamond. The laser bars are preferably mounted with their top surfaces facing down so that the bar lasing region will be as close as possible to the diamond material of the mesa. In addition, a material such as indium is used in the junction at 113 between carrier and laser bar as a mounting and interface supplement.

Thus, lying between the heat source in the lasing region of the laser bar and the diamond carrier is approximately 5 microns of laser bar material such as GaAs and the 3 microns of bonding material such as indium. Assuming a high power laser system with 1000 Watts per square centimeter of heat to be dissipated, the temperature gradient in the diamond carrier is only one degree Celsius and the temperature gradient from the laser bars to the heat sink is less than 10 degrees Celsius. The thermal resistance of this arrangement is thus almost fifty times lower than the most advanced previous laser packaging arrangement, the silicon monolithic microchannel.

The very same lasers that are today bound to a certain operating power level because of limitations in the heat dissipation capabilities of existing carriers can be operated at substantially higher power levels using the present invention Integrated Diamond Carrier. The Integrated Diamond Carrier also provides a more uniform temperature field for laser bars or other laser packaging arrangements and assures longer laser lifetimes because of the improved cooling efficiency achieved. As a rule of thumb, every reduction of 10 degrees Celsius in laser operating temperature results in a doubling of the laser life. The Integrated Diamond Carrier of the present invention is more robust, less costly to fabricate and as much as 50 times more efficient than the most cutting edge technology in diode laser packaging, the SiMM. The integrated beam steering mirrors of the Integrated Diamond Carrier also simplify the process of aligning the output light from the laser bar arrays.

When compared to the most cutting edge technology in diode laser packaging, the SIMM, the Integrated Diamond Carrier is as much as 50 times more efficient due to its substantially lower thermal resistance. This means that if the cooling surface is operating at 20 or 30 degrees Celsius, the laser bars packaged on the Integrated Diamond Carrier will be operating at 25 to 35 degrees Celsius as compared to 70 to 80 degrees Celsius. This improvement offers the potential to revolutionize the diode laser-application field. Temperature uniformity over the laser bars is also improved as a result of diamond's high thermal conductivity and heat spreading capability. Coherent lasing can be achieved while operating at higher power levels than are possible for present diode lasers because the temperature variations between individual stripes or ridge widths on a laser bar are smaller. This means that the output power for the same laser bars available commercially today can be higher. The fabrication of the Integrated Diamond Carrier is less complex than that of current competing cooling arrangements such as the SIMM. The Integrated Diamond Carrier is essentially grown as a complete package.

The basis for the Integrated Diamond Carrier concept is the fact that diamond has the highest thermal conductivity of all known materials and this is most important with respect to high power dissipations as encountered in other semiconductor devices for example. There are for example new applications for MEMS and MOEMS devices that can benefit from carriers customized to the particular application, but built the same way as the laser bar Integrated Diamond Carrier. The ability to grow diamond conformally on a mold, opens up ways to use prefabricated fixtures of diamond for other tools and work pieces that are not currently identified.

While the apparatus and method herein described constitute a preferred embodiment of the invention, it is to be understood that the invention is not limited to this precise form of apparatus or method and that changes may be made therein without departing from the scope of the invention, which is defined in the appended claims.

We claim:

1. Laser diode array apparatus comprising:
    a sacrificial substrate member, of first material composition, having a generally planar upper working surface with an ordered array of working surface indentations received therein;
    a first sub array of said sacrificial substrate working surface indentations comprising a plurality of parallel rows of elongated flat bottomed recessions extending across a substantial two dimensional working surface portion;
    a second sub array of said sacrificial substrate working surface indentations comprising plurality of parallel rows of elongated sloping cross sectional recessions of greater depth and cross sectional area than said first array indentations and of intermediate parallel location with respect to said first array indentations;
    each element in said second sub array of said sacrificial substrate working surface indentations including a sacrificial substrate member material crystal plane determined laser energy reflection surface, and;
    a deposited layer of electrically insulating thermally conductive laser diode array carrier structure-composing second material disposed over said sacrificial substrate member generally planar upper working surface and into a filling and conformed relationship with said first and second sub array working surface indentations;
    wherein said layer of thermally conductive laser diode array carrier structure-composing second material is comprised of a layer of diamond material;
    wherein said sacrificial substrate member of first material composition is comprised of semiconductor material, and;
    wherein said second sub array of said sacrificial substrate working surface indentations include sloping cross sectional portions aligning with a 111 crystal plane of said semiconductor material.

2. The laser diode array apparatus of claim 1 wherein said semiconductor sacrificial substrate member is comprised of Silicon semiconductor material.

3. The laser diode array apparatus of claim 1 wherein said first sub array of sacrificial substrate working surface indentations comprise a plurality of mesa pedestal mold elements and wherein said second sub array of sacrificial substrate working surface indentations comprise a plurality of integral laser light reflector elements.

4. The laser diode array apparatus of claim 1 further including a bath of sacrificial substrate member first material-removing liquid etchant surrounding said first material and second material layered structure.

* * * * *